United States Patent [19]

Toyofuku et al.

[11] Patent Number: 5,364,706
[45] Date of Patent: Nov. 15, 1994

[54] CLAD BONDING WIRE FOR SEMICONDUCTOR DEVICE

[75] Inventors: Katsuyuki Toyofuku; Ichiro Nagamatsu; Shinji Shirakawa; Hiroto Iga; Takeshi Kujiraoka; Kensei Murakami, all of Tokyo, Japan

[73] Assignee: Tanaka Denshi Kogyo Kabushiki Kaisha, Tokyo, Japan

[21] Appl. No.: 729,226

[22] Filed: Jul. 12, 1991

[30] Foreign Application Priority Data

| Jul. 20, 1990 | [JP] | Japan | 2-192791 |
| Jul. 20, 1990 | [JP] | Japan | 2-192792 |
| Jul. 20, 1990 | [JP] | Japan | 2-192793 |
| Jul. 20, 1990 | [JP] | Japan | 2-192794 |
| Jul. 20, 1990 | [JP] | Japan | 2-192795 |
| Jul. 20, 1990 | [JP] | Japan | 2-192796 |
| Jul. 20, 1990 | [JP] | Japan | 2-192797 |
| Jul. 20, 1990 | [JP] | Japan | 2-192798 |
| Jul. 20, 1990 | [JP] | Japan | 2-192799 |
| Jul. 20, 1990 | [JP] | Japan | 2-192800 |
| Jul. 20, 1990 | [JP] | Japan | 2-192801 |
| Jul. 20, 1990 | [JP] | Japan | 2-192802 |

[51] Int. Cl.$^5$ .................. B32B 15/01; B21C 37/04
[52] U.S. Cl. .................. 428/607; 428/670; 428/672
[58] Field of Search .............. 428/668, 669, 670, 672, 428/673, 607; 357/67; 427/117, 125; 174/126.2; 257/768, 784

[56] References Cited

U.S. PATENT DOCUMENTS

| 2,303,497 | 12/1942 | Reeve | 428/669 |
| 4,752,442 | 6/1988 | Asada et al. | 428/620 |

FOREIGN PATENT DOCUMENTS

| 54-23794 | 8/1979 | Japan . |
| 55-140139 | 11/1980 | Japan . |
| 56-21354 | 2/1981 | Japan . |
| 61-221336 | 10/1986 | Japan . |
| 64-017436 | 1/1989 | Japan | 428/672 |
| 6427237 | 1/1989 | Japan | 428/672 |
| 01110741 | 11/1989 | Japan | 428/672 |
| 1333848 | 10/1973 | United Kingdom . |

OTHER PUBLICATIONS

E. M. Wise, "The Platinum Metals", 1953, p. 291.

Primary Examiner—Benjamin R. Fuller
Assistant Examiner—Valerie Lund
Attorney, Agent, or Firm—Sandler, Greenblum & Bernstein

[57] ABSTRACT

A clad bonding wire for electrically connecting the bonding pad of a semiconductor device to an external lead comprises a core wire formed on one of high-purity Pd or a Pd alloy, high-purity Au or a Au alloy, high-purity Pt or a Pt alloy, and high-purity Ag or a Ag alloy, and a cladding cladding the core wire and formed of another one of the foregoing materials other than that forming the core wire. The wire-to-cladding diameter ratio $D_2/D_1$ is in the range of 15% to 60% or 85% to 99. When the tip of the clad bonding wire is heated to form a ball, part of the core wire and part of the cladding in a neck formed behind the ball diffuse into each other to form an alloy of the materials forming the core wire and the cladding between the core wire and the cladding to enhance the mechanical strength of the neck beyond that of other portion of the clad bonding wire.

10 Claims, 1 Drawing Sheet

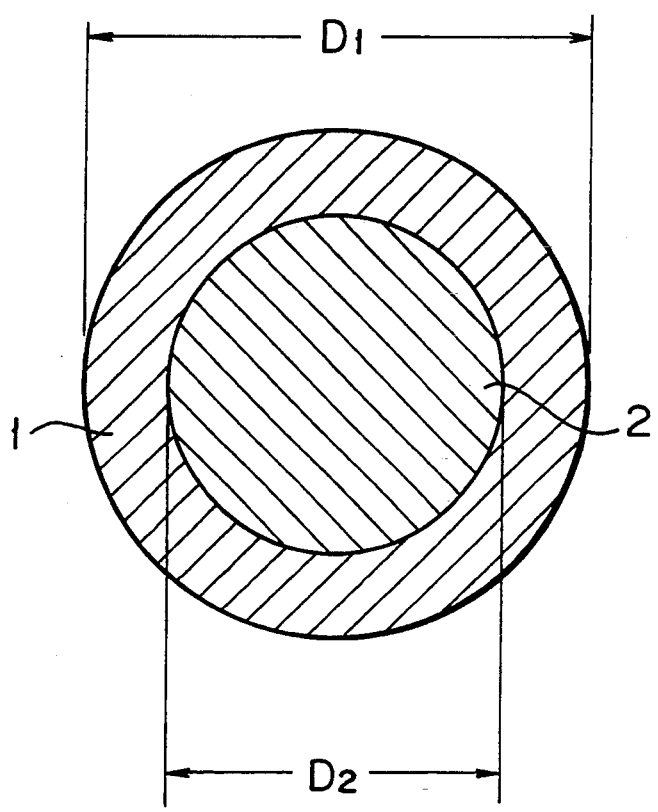

CLAD BONDING WIRE FOR SEMICONDUCTOR DEVICE

BACKGROUND OF THE INVENTION

1. Field of the Invention

The present invention relates to a clad bonding wire for connecting the electrodes of a semiconductor device to external leads and, more particularly, to a clad bonding wire suitable for connecting the electrodes of a semiconductor device to external leads by a ball bonding method.

2. Description of the Prior Art

In electrically connecting a semiconductor device to external leads with a bonding wire, such as a Au wire, by a ball bonding method, the tip of a bonding wire projecting from a capillary is fused in a ball with an electric torch, and the molten ball is pressed against the bonding pad of the semiconductor device to connect the bonding wire to the bonding pad, the bonding wire is extended in a curve between the bonding pad and an external lead, the bonding wire is connected to the external lead, and then the bonding wire is cut.

When the tip of the conventional bonding wire is heated to form a ball, a neck having a mechanical strength lower than that of the bonding wire is formed behind the ball. Therefore, the neck is liable to be broken during the wire bonding operation, the bonding wire making an electrical connection droops or bends due to the yielding of the neck, and the neck is liable to be broken by the concentration of stress on the neck due to alternate thermal expansion and thermal contraction caused by by cyclic temperature variation during temperature cycling test.

On the other hand, the recent progressive increase in the packaging density of LSIs and resultant increase in the number of pins on each LSI package require the use of finer bonding wires and the reduction of bonding pitch. However, reduction in diameter of the conventional bonding wire is limited and hence the conventional bonding wire is unable to meet the foregoing requirement because the neck formed in the known bonding wire is liable to break.

A composite bonding wire formed by cladding a core wire of high-purity Ag with high-purity Au or an Au alloy has been proposed in Japanese Patent Laid-open (Kokai) No. Sho 56-21354 to solve problems in the conventional bonding wires. However, this composite bonding wire has the following drawbacks. In a composite bonding wire formed by cladding a Ag core wire with Au cladding, a diffused layer of a sufficient thickness cannot be formed between the core wire and the cladding in the neck when the composite wire is heated to form a ball if the ratio of the diameter of the core wire to the outside diameter of the cladding is in a certain range, and hence the strength of the neck cannot be increased or even if a diffused layer of a sufficient thickness is formed in the neck, an excessively hard ball is formed to crack the package when the ball is pressed against the bonding pad of the package.

SUMMARY OF THE INVENTION

Accordingly, it is an object of the present invention to provide a clad bonding wire for a semiconductor device, capable of forming a neck having a strength equal to or higher than that of other portion thereof and of forming a ball which may not crack the package, when heated.

In one aspect of the present invention, a clad bonding wire comprises a core wire of one of high-purity Pd, high-purity Au, high-purity Pt, high-purity Ag and the alloys of those metals, and a cladding of another one of those metals and the alloys of those metals, cladding the core wire.

Preferably, the material for cladding the core wire of high-purity Pd or a Pd alloy is any one of high-purity Au, high-purity Pt, high-purity Ag and alloys of these metals; the material for cladding the core wire of high-purity Au or a Au alloy is any one of high-purity Pd, high-purity Pt, high-purity Ag and alloys of these metals; the material for cladding the core wire of high-purity Pt or a Pt alloy is any one of high-purity Pd, high-purity Au, high-purity Ag and alloys of these metals; and the material for cladding the core wire of high-purity Ag or a Ag alloy is any one of high-purity Au, high-purity Pd, high-purity Pt and alloys of these metals.

Preferably, the ratio of the diameter of the core wire to the outside diameter of the cladding (hereinafter referred to as "wire-to-cladding diameter ratio") is in the range of 15 to 60% or in the range of 85 to 99%.

High-purity Pd is such as having a purity of 99.9% or higher and containing unavoidable impurities. The Pd alloy is an alloy of high-purity Pd containing one or some of Pt in 8 at.% or less, Ag in 5 at.% or less, In, Mg, Mo or Y in 5 at.% or less, Ge or La in 1 at.% or less, and low-boiling elements having a low boiling point lower than the fusing point of the material forming the wire. Such a Pd alloy maintains a sufficient mechanical strength both under an ordinary temperature and under a high temperature, enables high-speed bonding operation and prevents the coarsening of crystal grains in the neck in forming a ball.

High-purity Au is such as having a purity of 99.99% or above containing unavoidable impurities. The Au alloy, in the case of Pd core, is an alloy of high-purity Au containing one or some of Ag 20 at.% or less, Pt in 15 at.% or less, Cu, In, Ge, Mo, Y or Zr in 5 at.% or less, Be, Ca, La or Mg in 1 at.% or less and low-boiling elements having a low boiling point lower than the fusing point of the material forming the wire. Further, the Au alloy, in the case of Pt core, is an alloy of high-purity Au containing one or some of Ag 20 at.% or less, Pd in 20 at.% or less, Cu, In, Ge, Mo, Y or Zr in 5 at.% or less, Be, Ca, La or Mg in 1 at.% or less and low-boiling elements having a low boiling point lower than the fusing point of the material forming the wire. Such an Au alloy. maintains a sufficient mechanical strength both under an ordinary temperature and under a high temperature, enables high-speed bonding operation and prevents the coarsening of crystal grains in the neck in forming a ball.

High-purity Pt is such as having a purity of 99.95% or above containing unavoidable impurities. The Pt alloy is an alloy of high-purity Pt containing one or some of Ag in 5 at.% or less, Pd in 8 at.% or less, be, Cu or Mo in 5 at.% or less, Ca or In in 1 at.% or less and low-boiling elements having a low boiling point lower than the fusing point of the material forming the wire. Such a Pt alloy maintains a sufficient mechanical strength both under an ordinary temperature and under a high temperature, enables high-speed bonding operation and prevents the coarsening of crystal grains in the neck in forming a ball.

High-purity Ag is such as having a purity of 99.99% or above containing unavoidable impurities. The Ag alloy is an alloy of high-purity Ag containing one or some of Pd in 20 at.% or less, Pt in 8 at.% or less, Cu, In, Mg or Y in 5 at.% or less, Be, Ca, La or Zr in 1 at.% or less and low-boiling elements having a low boiling point lower than the fusing point of the material forming the wire. Such a Ag alloy maintains a sufficient mechanical strength both under an ordinary temperature and under a high temperature, enables high-speed bonding operation and prevents the coarsening of crystal grains in the neck in forming a ball.

When the tip of a clad bonding wire in accordance with the present invention is heated to form a ball, a neck is formed behind the ball, part of the core wire and part of the cladding diffuse into each other to form a diffused layer of an alloy of the materials forming the core wire and the cladding in the neck to reinforce the neck. The strength of the neck having the diffused layer is higher than that of other portion of the clad bonding wire.

The wire-to-cladding diameter ratio of a clad bonding wire consisting of a core wire of high-purity Ag or a Ag alloy, and a cladding of high-purity Au or a Au alloy is limited to a value in a certain range. If the wire-to-cladding diameter ratio is less than 15% or greater than 99%, a diffused layer having a sufficient thickness cannot be formed between the core wire and the cladding in the neck when the clad bonding wire is heated to form a ball, and hence the strength of the neck cannot be enhanced. If the wire-to-cladding diameter ratio is in the range of 60 to 85%, a diffused layer having a sufficient thickness is formed in the neck to reinforce the neck, whereas an excessively hard ball is formed. Such an excessively hard ball may possibly crack a package in connecting the ball to the bonding pad of the package.

Accordingly, the wire-to-cladding diameter ratio must be in the range of 15 to 60% or in the range of 85 to 99% to form a diffused layer of a Ag—Au alloy having a sufficient thickness to enhance the strength of the neck and to form a ball of an appropriate hardness. Since the clad bonding wire of a construction in accordance with the present invention is capable of forming a neck having a sufficient mechanical strength in forming a ball by heating the tip of the same, the clad bonding wire can be formed in a sufficiently small diameter.

Thus, a diffused layer of an alloy of the materials forming the cladding and the core is formed in the neck of the clad bonding wire when the same is heated to form a ball to enhance the mechanical strength of the neck beyond that of other portion of the clad bonding wire, so that the breakage of the neck during wire bonding operation and the sagging of the bonding wire extended in a curve can be prevented and the possibility of breakage of the clad bonding wire at the neck during use is reduced remarkably, which enhances the reliability of the semiconductor device.

The possibility of forming the clad bonding wire in a very small diameter enables increase in the packaging density of LSIs.

BRIEF DESCRIPTION OF THE DRAWING

The above and other objects, features and advantages of the present invention will become more apparent from the following description taken in connection with the accompanying drawing, in which:

A single FIGURE is an enlarged sectional view of assistance in explaining the dimensions of a clad bonding wire in a preferred embodiment according to the present invention.

DESCRIPTION OF THE PREFERRED EMBODIMENTS

The present invention will be described hereinafter in connection with the following examples.

EXAMPLE 1

Sample clad bonding wires of 30 μm in diameter were fabricated by cladding core wires 2 of high-purity Pd or a Pd alloy with claddings 1 of high-purity Au or a Au alloy to form clad wires, drawing the clad wires and annealing the same during drawing, and subjecting the drawn clad wires to a stress relieving process. The sample clad bonding wires differ from each other in the wire-to-cladding diameter ratio $D_2/D_1$, where $D_1$ is the outside diameter of the cladding 1, and $D_2$ is the diameter of the core wire 2.

Samples 1 to 10 are clad bonding wires formed by cladding core wires 2 of high purity Pd with cladding 1 of high-purity Au, respectively; Samples 11 and 12 are clad bonding wires formed by cladding core wires 2 of high-purity Pd with claddings 1 of a Au alloy containing 10 at.% Ag and the balance of high-purity Au, respectively; Sample 13 is a clad bonding wire formed by cladding a core wire 2 of a Pd alloy containing 2 at.% Ag and the balance of high-purity Pd with a cladding 1 of high-purity Au; Sample 14 is a clad bonding wire formed by cladding a core wire 2 of high-purity Pd or a Pd alloy with a cladding 1 of high-purity Au or a Au alloy, in which both the cladding 1 and the core wire 2 or either the cladding 1 or the core wire 2 contains a low-boiling element having a low boiling point lower than the fusing point of the base material forming the same; and Sample 15 is a conventional bonding wire for a semiconductor device as a comparative example.

In Example 1, the cladding 1 of Sample 14 is formed of high-purity Au, and the core wire 2 of the same is formed of high-purity Pd containing 500 at ppm P, i.e., a low-boiling element having a low boiling point. When the clad bonding wire in Sample 14 is heated to form a ball, the low-boiling element evaporates in the ball to prevent the characteristic gas absorption of the metal forming the ball, so that a satisfactory ball can be formed. The evaporating effort of the Low-boiling element contained in the neck induces stress in the neck to enhance the breaking strength of the neck beyond that of other portion of the clad bonding wire.

Sample 15 is a Au bonding wire of high-purity Au (99.99%).

The sample clad bonding wires were subjected to n cycles of pull test (n=40). The results of the pull test are tabulated in Table 1.

Samples 1 to 14 were evaluated in terms of the number of mode C breakages and the number of cracked chips and were classified into three classes represented by a double circle (excellent), a circle (good) and a cross (bad) in Table 1 on the basis of the results of evaluation.

It is obvious from Table 1 that the numbers of mode C breakages of the clad bonding wires in Samples 1 to 14, i.e., the clad bonding wires of the present invention, are far greater than the number of mode C breakages of the bonding wire in Sample 15, i.e., a comparative example of the conventional bonding wire, which proves that the necks of the clad bonding wires of the present invention are stronger than other portions of the corresponding clad bonding wires. Furthermore, the clad bonding wires of the present invention meeting an inequality: $15\% \leq D_2/D_1 \leq 75\%$ or $95\% \leq D_2/D_1 \leq 99\%$ form necks having a sufficient strength and balls having appropriate hardness. It is understood from Table 1 that an optimum clad bonding wire can be formed by using a cladding 1 of a Au alloy or a core wire 2 of a Pd alloy or by using a material containing a low-boiling element.

EXAMPLE 2

Sample clad bonding wires of 30 μm in diameter were fabricated by cladding core wires 2 of high-purity Au or a Au alloy with claddings 1 of high-purity Pd or a Pd alloy, respectively, to form clad wires, drawing the clad wires and annealing the same during drawing, and subjecting the drawn clad wires to a stress relieving process. The sample clad bonding wires differ from each other in the wire-to-cladding diameter ratio $D_2/D_1$.

duces stress in the neck to enhance the breaking strength of the neck beyond that of other portion of the clad bonding wire.

Sample 15 is a Au bonding wire of high-purity Au (99.99%).

The sample clad bonding wires were subjected to n cycles of pull test (n=40). The results of the pull test are tabulated in Table 2.

The numbers of mode C breakage of the clad bonding wires of the present invention are far greater than that of mode C breakages of the conventional bonding wire, which proves that the necks of the clad bonding wires of the present invention are stronger than other portions of the corresponding clad bonding wires. The clad bonding wires meeting an inequality: $15\% \leq D_2/D_1 \leq 25\%$ or $70\% \leq D_2/D_1 \leq 99\%$ form necks having a sufficient strength and balls having an appro-

TABLE 1

| Samples No. | Material of cladding ($D_1$) | Material of core wire ($D_2$) | $D_2/D_1$ (%) | Pull strength (g) | Number of mode C breakages (n = 40) | Cracking of chip | Class |
| --- | --- | --- | --- | --- | --- | --- | --- |
| 1 | Au | Pd | 14.0 | 12.1 | 6 | Not occurred | X |
| 2 | " | " | 15.0 | 12.2 | 25 | " | |
| 3 | " | " | 40.0 | 13.1 | 37 | " | ◎ |
| 4 | " | " | 75.0 | 15.9 | 34 | " | |
| 5 | " | " | 76.0 | 16.0 | 35 | Occurred | X |
| 6 | " | " | 94.0 | 18.2 | 30 | " | X |
| 7 | " | " | 95.0 | 18.3 | 36 | Not occurred | ◎ |
| 8 | " | " | 97.0 | 18.6 | 30 | " | |
| 9 | " | " | 99.0 | 18.9 | 23 | " | |
| 10 | " | " | 99.5 | 18.9 | 8 | " | X |
| 11 | Au + Ag (10 at %) | " | 40.0 | 16.9 | 33 | " | |
| 12 | " | " | 97.0 | 18.9 | 31 | " | |
| 13 | Au | Pd + Ag (2 at %) | 40.0 | 13.4 | 36 | " | ◎ |
| 14 | " | Pd + P (500 at ppm) | 40.0 | 13.2 | 38 | " | ◎ |
| 15 | | Au (99.99%) | | 12.0 | 2 | " | |

Samples 1 to 10 are clad bonding wires formed by cladding core wires 2 of high-purity Au with claddings 1 of high-purity Pd, respectively; Samples 11 and 12 are clad bonding wires formed by cladding core wires 2 of high-purity Au with claddings 1 of high-purity Pd containing 2 at.% Ag, respectively; Sample 13 is a clad bonding wire formed by cladding a core wire 2 of high-purity Au containing 10 at.% Ag with a cladding 1 of high-purity Pd; Sample 14 is a clad bonding wire formed by cladding a core 2 of high-purity Au or a Au alloy with a cladding 1 of high-purity Pd or a Pd alloy, in which both the cladding 1 and the core wire 2 or either the cladding 1 or the core wire 2 contains a low-boiling element having a boiling point lower than the fusing point of the base material forming the same; and Sample 15 is a conventional bonding wire for a semiconductor device as a comparative example.

In Example 2, the cladding 1 of Sample 14 is formed of high-purity Pd and the core wire 2 of the same is formed of high-purity Au containing 500 at ppm P, i.e., a low-boiling element. When the clad boding wire in Sample 14 is heated to from a ball, the low-boiling element evaporates in the ball to prevent the characteristic gas absorption of the metal forming the ball, so that a satisfactory ball can be formed. The evaporating effort of the low-boiling element contained in the neck inpriate hardness. Furthermore, it is understood from Table 2 that an optimum clad bonding wire can be formed by using a cladding 1 of a Pd alloy or a core wire 2 of a Au alloy or by using a material containing a low-boiling element.

EXAMPLE 3

Sample clad bonding wires of 30 μm in diameter were fabricated by cladding core wires 2 of high-purity Pd or a Pd alloy with claddings 1 of high-purity Pt or a Pt alloy to form clad wires, drawing the clad wires and annealing the same during drawing, and subjecting the drawn clad wires to a stress relieving process. The sample clad bonding wires differ from each other in the wire-to-cladding diameter ratio $D_2/D_1$.

Samples 1 to 10 are clad bonding wires formed by cladding core wires 2 of high-purity Pd with claddings 1 of high-purity Pt, respectively; Samples 11 and 12 are cladding bonding wires formed by cladding core wires 2 of high-purity Pd with claddings 1 of high-purity Pt containing 2 at.% Au, respectively; Sample 13 is a clad bonding wire formed by cladding a core wire 2 of high-purity Pd containing 3 at.% Au with a cladding 1 of high-purity Pt; Sample 14 is a clad bonding wire formed by cladding high-purity Pd or a Pd alloy with a cladding 1 of

TABLE 2

| Samples No. | Material of cladding ($D_1$) | Material of core wire ($D_2$) | $D_2/D_1$ (%) | Pull strength (g) | Number of mode C breakages (n = 40) | Cracking of chip | Class |
| --- | --- | --- | --- | --- | --- | --- | --- |
| 1 | Pd | Au | 14.0 | 18.9 | 7 | Not occurred | X |
| 2 | " | " | 15.0 | 18.8 | 23 | " | |
| 3 | " | " | 20.0 | 18.7 | 33 | " | |

TABLE 2-continued

| Samples No. | Material of cladding (D$_1$) | Material of core wire (D$_2$) | D$_2$/D$_1$ (%) | Pull strength (g) | Number of mode C breakages (n = 40) | Cracking of chip | Class |
|---|---|---|---|---|---|---|---|
| 4 | " | " | 25.0 | 18.6 | 32 | " | |
| 5 | " | " | 26.0 | 18.5 | 32 | Occurred | X |
| 6 | " | " | 69.0 | 15.7 | 29 | " | X |
| 7 | " | " | 70.0 | 15.6 | 34 | Not occurred | |
| 8 | " | " | 85.0 | 13.9 | 35 | " | ◉ |
| 9 | " | " | 99.0 | 12.1 | 27 | " | |
| 10 | " | " | 99.5 | 12.1 | 6 | " | X |
| 11 | Pd + Ag (2 at %) | " | 20.0 | 20.6 | 35 | " | ◉ |
| 12 | " | " | 85.0 | 14.5 | 36 | " | ◉ |
| 13 | Pd | Au + Ag (10 at %) | 85.0 | 17.2 | 35 | " | ◉ |
| 14 | " | Au + P (500 at ppm) | 85.0 | 14.3 | 38 | " | ◉ |
| 15 | | Au (99.99%) | | 12.0 | 2 | " | | high-purity Pt or a Pt alloy, in which both the cladding 1 and the core wire 2 or either the cladding 1 or the core wire 2 contains a low-boiling element having a boiling point lower than the fusing point of the base material forming the same; and Sample 15 is a conventional bonding wire for a semiconductor device as a comparative example.

In Example 3, the cladding 1 of Sample 14 is formed of high-purity Pt, and the core wire 2 of the same is formed of high-purity Pd containing 500 at ppm P, i.e., a low-boiling element. When the clad bonding wire in Sample 14 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire of high-purity Au (99.99%).

The sample clad bonding wires were subjected to n cycles of pull test (n=40). The results of the pull test are tabulated in Table 3.

wire can be formed by using a cladding 1 of a Pt alloy or a core wire 2 of a Pd alloy or by using a material containing a low-boiling element.

EXAMPLE 4

Sample clad bonding wires of 30 μm in diameter were fabricated by cladding core wires 2 of high-purity Pt or a Pt alloy with claddings 1 of high-purity Pd or a Pd alloy to form clad wires, drawing the clad wires and annealing the same during drawing, and subjecting the drawn clad wires to a stress relieving process. The sample clad bonding wires differ from each other in the wire-to-cladding diameter ratio D$_2$/D$_1$.

Samples 1 to 10 are clad bonding wires formed by cladding core wires 2 of high-purity Pt with claddings of high-purity Pd, respectively; Samples 11 and 12 are clad bonding wires formed by cladding core wires of high-purity Pt with claddings 1 of high-purity Au containing 3 at.% Au, respectively; Sample 13 is a clad bonding wire formed by cladding a core wire 2 of high-purity Pt containing 2 at.% Au with a cladding 1 of high-purity Pd Sample 14 is a clad bonding wire formed by cladding a core wire 2 with a cladding 1, in which both the cladding 1 and the core wire 2 or either the

TABLE 3

| Samples No. | Material of cladding (D$_1$) | Material of core wire (D$_2$) | D$_2$/D$_1$ (%) | Pull strength (g) | Number of mode C breakages (n = 40) | Cracking of chip | Class |
|---|---|---|---|---|---|---|---|
| 1 | Pt | Pd | 14.0 | 14.1 | 5 | Not occurred | X |
| 2 | " | " | 15.0 | 14.1 | 22 | " | |
| 3 | " | " | 20.0 | 14.2 | 30 | " | |
| 4 | " | " | 30.0 | 14.5 | 35 | " | ◉ |
| 5 | " | " | 31.0 | 14.5 | 33 | Occurred | X |
| 6 | " | " | 94.0 | 18.4 | 31 | " | X |
| 7 | " | " | 95.0 | 18.5 | 34 | Not occurred | |
| 8 | " | " | 97.0 | 18.7 | 36 | " | ◉ |
| 9 | " | " | 99.0 | 18.9 | 28 | " | |
| 10 | " | " | 99.5 | 19.0 | 4 | " | X |
| 11 | Pt + Au (2 at %) | " | 20.0 | 20.4 | 33 | " | |
| 12 | " | " | 95.0 | 19.1 | 31 | " | |
| 13 | Pt | Pd + Au (3 at %) | 20.0 | 14.3 | 30 | " | |
| 14 | " | Pd + P (500 at ppm) | 20.0 | 14.2 | 35 | " | ◉ |
| 15 | | Au (99.99%) | | 12.0 | 2 | " | |

It is obvious from Table 3 that the numbers of mode C breakages in the clad bonding wires of the present invention are far greater than that of mode C breakages of the comparative example of the conventional bonding wire, which proves that the necks of the clad bonding wires of the present invention are stronger than other portions of the corresponding clad bonding wires, Furthermore, the clad bonding wires of the present invention meeting an inequality: $15\% \leq D_2/D_1 \leq 30\%$ or $95\% \leq D_2/D_1 \leq 99\%$ form necks having a sufficient strength and balls having appropriate hardness. It is understood from Table 3 that an optimum clad bonding cladding 1 or the core wire 2 contains a low-boiling element having a boiling point lower than the fusing point of the base material forming tile same; and Sample 15 is a conventional bonding wire for a semiconductor device as a comparative example.

In Example 4, the cladding 1 of Sample 14 is formed of high-purity Pd, and the core wire is formed of high-purity Pt containing 500 at ppm P, i.e., a low-boiling element. When the clad bonding wire in Sample 14 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire formed of high-purity Au (99.99%).

The samples were subjected to n cycles of pull test (n=40). The results of the pull test are tabulated in Table 4.

sample clad bonding wires differ from each other in the wire-to-cladding diameter ratio $D_2/D_1$.

Samples 1 to 10 are clad bonding wires formed by cladding core wires 2 of high-purity Pt with claddings 1 of high-purity Au, respectively; Samples 11 and 12 are clad bonding wires formed by cladding core wires 2 of high-purity Pt with claddings 1 of high-purity Au containing 10 at.% Pd, respectively; Sample 13 is a clad bonding wire formed by cladding a core wire 2 of high-purity Pt containing 5 at% Pd with a cladding 1 of high-purity Au; Sample 14 is a clad bonding wire

TABLE 4

| Samples No. | Material of cladding ($D_1$) | Material of core wire ($D_2$) | $D_2/D_1$ (%) | Pull strength (g) | Number of mode C breakages (n = 40) | Cracking of chip | Class |
|---|---|---|---|---|---|---|---|
| 1 | Pd | Pt | 14.0 | 18.9 | 6 | Not occurred | X |
| 2 | " | " | 15.0 | 18.9 | 23 | " | |
| 3 | " | " | 25.0 | 18.7 | 29 | " | |
| 4 | " | " | 30.0 | 18.6 | 35 | " | ⊙ |
| 5 | " | " | 31.0 | 18.5 | 33 | Occurred | X |
| 6 | " | " | 94.0 | 14.6 | 34 | " | X |
| 7 | " | " | 95.0 | 14.5 | 34 | Not occurred | |
| 8 | " | " | 97.0 | 14.3 | 36 | " | ⊙ |
| 9 | " | " | 99.0 | 14.1 | 27 | " | |
| 10 | " | " | 99.5 | 14.0 | 5 | " | X |
| 11 | Pd + Au (3 at %) | " | 20.0 | 20.0 | 31 | " | |
| 12 | " | " | 97.0 | 14.4 | 34 | " | |
| 13 | Pd | Pt + Au (2 at %) | 20.0 | 19.1 | 35 | " | ⊙ |
| 14 | " | Pt + P (500 at ppm) | 20.0 | 18.8 | 38 | " | ⊙ |
| 15 | | Au (99.99%) | | 12.0 | 2 | " | |

It is obvious from Table 4 that the numbers of mode C breakages in the clad bonding wires of the present invention are far greater than the number of mode C breakages in Sample 15, i.e., a comparative example of the conventional bonding wire, which proves that the necks of the clad bonding wires of the present invention are stronger than other portions of the corresponding clad bonding wires. Furthermore, the clad bonding wires of the present invention meeting an inequality: $15\% \leq D_2/D_1 \leq 30\%$ or $95\% \leq D_2/D_1 \leq 99\%$ form necks having a sufficient strength and balls having appropriate hardness. It is understood from Table 4 that an optimum clad bonding wire can be formed by using a cladding 1 of a Pd alloy or a core wire 2 of a Pt alloy or by using a material containing a low-boiling element.

EXAMPLE 5

Sample clad bonding wires of 30 μm in diameter were fabricated by cladding core wires 2 of high-purity Pt or a Pt alloy with claddings 1 of high-purity Au or a Au alloy to form clad wires, drawing the clad wires and annealing the same during drawing, and subjecting the drawn clad wires to a stress relieving process. The formed by cladding a core wire 2 of high-purity Pt of a Pt alloy with a cladding 1 of high-purity Au or a Au alloy, in which both the cladding 1 and the core wire 2 or either the cladding 1 or the core wire 2 contains a low-boiling element having a boiling point lower than the fusing point of the base material forming the same; and Sample 15 is a conventional bonding wire for semiconductor device as a comparative sample.

In Example 5, the cladding 1 of Sample 14 is formed of high-purity Au, and the core wire 2 is formed of high-purity Pt containing 500 at ppm P, i.e., a low-boiling element. When the clad bonding wire in Sample 14 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire formed of high-purity Au (99.99%).

The samples were subjected to n cycles of pull test (n=40). The results of the pull test are tabulated in Table 5.

TABLE 5

| Samples No. | Material of cladding ($D_1$) | Material of core wire ($D_2$) | $D_2/D_1$ (%) | Pull strength (g) | Number of mode C breakages (n = 40) | Cracking of chip | Class |
|---|---|---|---|---|---|---|---|
| 1 | Au | Pt | 14.0 | 12.0 | 3 | Not occurred | X |
| 2 | " | " | 15.0 | 12.0 | 24 | " | |
| 3 | " | " | 20.0 | 12.1 | 35 | " | ⊙ |
| 4 | " | " | 40.0 | 12.3 | 32 | " | |
| 5 | " | " | 41.0 | 12.3 | 35 | Occurred | X |
| 6 | " | " | 97.0 | 13.9 | 30 | " | X |
| 7 | " | " | 98.0 | 13.9 | 31 | Not occurred | |
| 8 | " | " | 98.5 | 13.9 | 33 | " | |
| 9 | " | " | 99.0 | 14.0 | 28 | " | |
| 10 | " | " | 99.5 | 14.0 | 5 | " | X |
| 11 | Au + Pd (10 at %) | " | 25.0 | 18.7 | 35 | " | ⊙ |
| 12 | " | " | 99.0 | 14.1 | 29 | " | |
| 13 | Au | Pt + Pd (5 at %) | 25.0 | 12.3 | 30 | " | |

TABLE 5-continued

| Samples No. | Material of cladding ($D_1$) | Material of core wire ($D_2$) | $D_2/D_1$ (%) | Pull strength (g) | Number of mode C breakages (n = 40) | Cracking of chip | Class |
| --- | --- | --- | --- | --- | --- | --- | --- |
| 14 | " | Pt + P (500 at ppm) | 25.0 | 12.2 | 38 | " | ⊙ |
| 15 | | Au (99.99%) | | 12.0 | 2 | " | |

It is obvious from Table 5 that the numbers of mode C breakages in the clad bonding wires of the present invention are far greater than the number of mode C breakage in Sample 15, i.e., a comparative example of the conventional bonding wire, which proves that the necks of the clad bonding wires of the present invention are stronger than other portions of the corresponding clad bonding wire. Furthermore, the clad bonding wires of the present invention meeting an inequality: $15\% \leqq D_2/D_1 \leqq 40\%$ or $98\% \leqq D_2D_1 \leqq 99\%$ form necks having a sufficient strength and balls having appropriate hardness. It is understood from Table 5 that an optimum clad bonding wire can be formed by using a cladding 1 of a Au alloy or a core wire 2 of a Pt alloy or by using a material containing a low-boiling element.

In Example 6, the cladding 1 of Sample 14 is formed of high-purity Pt, and the core wire 2 of the same is formed of Au containing 500 at ppm P, i.e., a low-boiling element. When the cladding bonding wire is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire of high-purity Au (99.99%).

The samples were subjected to n cycles of pull test (n=40). The results of the pull test are tabulated in Table 6.

TABLE 6

| Samples No. | Material of cladding ($D_1$) | Material of core wire ($D_2$) | $D_2/D_1$ (%) | Pull strength (g) | Number of mode C breakages (n = 40) | Cracking of chip | Class |
| --- | --- | --- | --- | --- | --- | --- | --- |
| 1 | Pt | Au | 13.0 | 14.0 | 5 | Not occurred | X |
| 2 | " | " | 14.0 | 14.0 | 22 | " | |
| 3 | " | " | 15.0 | 14.0 | 25 | " | |
| 4 | " | " | 16.0 | 13.9 | 26 | " | |
| 5 | " | " | 17.0 | 13.9 | 29 | Occurred | X |
| 6 | " | " | 94.0 | 12.2 | 31 | " | X |
| 7 | " | " | 95.0 | 12.2 | 36 | Not occurred | ⊙ |
| 8 | " | " | 97.0 | 12.1 | 30 | " | |
| 9 | " | " | 99.0 | 12.0 | 31 | " | |
| 10 | " | " | 99.5 | 12.0 | 5 | " | X |
| 11 | Pt + Pd (5 at %) | " | 15.0 | 16.9 | 29 | " | |
| 12 | " | " | 97.0 | 12.3 | 33 | " | |
| 13 | Pt | Au + Pd (10 at %) | 97.0 | 18.7 | 36 | " | ⊙ |
| 14 | " | Au + P (500 at ppm) | 97.0 | 12.6 | 37 | " | ⊙ |
| 15 | | Au (99.99%) | | 12.0 | 2 | " | |

EXAMPLE 6

Sample clad bonding wires of 30 μm diameter were fabricated by cladding core wires 2 of high-purity Au or a Au alloy with claddings 1 of high-purity Pt of a Pt alloy to form clad wires, drawing the clad wires and annealing the same during drawing, and subjecting the drawn clad wires to a stress relieving process. The sample clad bonding wires differ from each other in the wire-to-cladding ratio $D_2/D_1$.

Samples 1 to 10 are clad bonding wires formed by cladding core wires 2 of high-purity Au with claddings 1 of high-purity Pt, respectively; Samples 11 and 12 are clad bonding wires formed by cladding core wires 2 of high-purity Au with claddings 1 of high-purity Pt containing 5 at.% Pd, respectively; Sample 13 is a clad bonding wire formed by cladding a core wire 2 of high-purity Au containing 10 at.% Pd with a cladding 1 of high-purity Pt; Sample 14 is a clad bonding wire formed by cladding a core wire 2 of high-purity Au or a Au alloy with a cladding 1 of high-purity Pt or a Pt alloy, in which both the cladding 1 and the core wire 2 or either the cladding 1 or the core wire 2 contains a low-boiling element having a boiling point lower than the fusing point of the base material forming the same; and Sample 15 is a conventional bonding wire as a comparative example.

It is obvious from Table 6 that the numbers of mode C breakage in the clad bonding wires of the present invention are far greater than the number of mode C breakages in Sample 15, i.e. a comparative example of the conventional bonding wire, which proves that the necks of the clad bonding wires of the present invention are stronger than other portion of the corresponding clad bonding wires. Furthermore, the clad bonding wires of the present invention meeting an inequality: $14\%\ D_2/D_1 \leqq 16\%$ or $95\% \leqq D_2/D_1 \leqq 99\%$ form necks having a sufficient strength and balls having appropriate hardness. It is understood from Table 6 that an optimum clad bonding wire can be formed by using a cladding 1 of a Pt alloy or a core wire 2 of a Au alloy or by using a material containing a low-boiling element.

EXAMPLE 7

Sample clad bonding wires of 30 μm in diameter were fabricated by cladding core wires 2 of high-purity Ag or a Ag alloy with claddings 1 of high-purity Au or a Au alloy to form clad wires, drawing the clad wires and annealing the same during drawing, and subjecting the drawn clad wires to a stress relieving process. The sample clad bonding wires differ from each other in the wire-to-cladding diameter ratio $D_2/D_1$.

Samples 10 to 10 are clad bonding wires formed by cladding core wires 2 of high-purity Ag with claddings 1 of high-purity Au, respectively; Samples 11 and 12 are clad bonding wires formed by cladding core wires 2 of high-purity Ag with claddings 1 of high-purity Au containing 10 at.% Pd, respectively; Sample 13 is a clad bonding wire formed by cladding a core wire 2 of high-purity Ag containing 10 at% Pd with a cladding 1 of high-purity Au; Sample 14 is a clad bonding wire formed by cladding a core wire of high-purity Ag or a Ag alloy with a cladding 1 of high-purity Au or a Au alloy, in which both the cladding 1 and the core wire 2 or either the cladding 1 or the core wire 2 contains a low-boiling element having a boiling point lower than the fusing point of the base material forming the same; and Sample 15 is a conventional bonding wire for a semiconductor device as a comparative example.

In Example 7, the cladding 1 of Sample 14 is formed of high-purity Au, and the core wire of the same is formed of high-purity Ag alloy with cladding 1 containing 500 at ppm P, i.e., a low-boiling element. When the clad bonding wire in Sample 14 is heated to form a ball, the low-boiling element evaporates to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire of high-purity Au (99.99%).

The samples were subjected to n cycles of pull test (n=40). The results of the pull test are tabulated in Table 7.

strength and a ball having appropriate hardness can be formed by using a cladding 1 of a Au alloy or a core wire 2 of a Ag alloy or by using a material containing a low-boiling element.

EXAMPLE 8

Sample clad bonding wires of 30 $\mu$m in diameter were fabricated by cladding core wires 2 of high-purity Au or a Au alloy with claddings 1 of high-purity Ag or a Ag alloy to form clad wires, drawing the clad wires and annealing the same during drawing, and subjecting the drawn clad wires to a stress relieving process. The sample clad bonding wires differ from each other in the wire-to-cladding ratio $D_2/D_1$.

Samples 1 to 10 are clad bonding wires formed by cladding core wires 2 of high-purity Au with claddings 1 of high-purity Ag, respectively; Samples 11 and 12 are clad bonding wires formed by cladding core wires 2 of high-purity Au with claddings 1 of high-purity Ag containing 10 at.% Pd, respectively; Sample 13 is a clad bonding wire formed by cladding a core wire 2 of high-purity Au containing 10 at.% Pd with a cladding 1 of high-purity Ag; Sample 14 is a clad bonding wire formed by cladding a core 2wire 2 of high-purity Au or a Au alloy with a cladding 1 of high-purity Ag or a Ag alloy, in which both the cladding 1 and the core wire 2 or either the cladding 1 or the core wire 2 contains a low-boiling element having a boiling point lower than the fusing point of the base material of the same; and Sample 15 is a conventional bonding wire for a semiconductor device as a comparative example.

In Example 8, the cladding 1 of Sample 14 is formed of high-purity Ag, and the core wire 2 of the same is formed of high-purity Au containing 500 at ppm P i.e.,

TABLE 7

| Samples No. | Material of cladding (D₁) | Material of core wire (D₂) | $D_2/D_1$ (%) | Pull strength (g) | Number of mode C breakages | Cracking of chip | Class |
|---|---|---|---|---|---|---|---|
| 1 | Au | Ag | 14.0 | 12.0 | 3 | Not occurred | X |
| 2 | " | " | 15.0 | 12.0 | 22 | " | |
| 3 | " | " | 40.0 | 12.2 | 35 | " | ◉ |
| 4 | " | " | 60.0 | 12.5 | 31 | " | |
| 5 | " | " | 61.0 | 12.6 | 32 | Occurred | X |
| 6 | " | " | 84.0 | 13.1 | 33 | " | X |
| 7 | " | " | 85.0 | 13.1 | 33 | Not occurred | |
| 8 | " | " | 95.0 | 13.4 | 35 | " | ◉ |
| 9 | " | " | 99.0 | 13.5 | 29 | " | |
| 10 | " | " | 99.5 | 13.5 | 7 | " | X |
| 11 | Au + Pd (10 at %) | " | 50.0 | 17.6 | 30 | " | |
| 12 | " | " | 95.0 | 14.0 | 27 | " | |
| 13 | Au | Ag + Pd (10 at %) | 50.0 | 13.3 | 31 | " | |
| 14 | " | Ag + P (500 at ppm) | 50.0 | 12.5 | 35 | " | ◉ |
| 15 | | Au (99.99%) | | 12.0 | 2 | " | |

It is obvious from Table 7 that the numbers of mode C breakages in the clad bonding wires of the present invention meeting an inequality: 15%≦$D_2/D_1$≦60% or 85%≦$D_2/D_1$≦995 are far greater than the number of mode C breakages in the clad bonding wires not meeting the inequality, which proves that the necks of the clad bonding wires meeting the inequality are stronger than other portion of the corresponding clad bonding wires and that the clad bonding wires meeting the inequality form balls having appropriate hardness because these balls do not cause the cracking of the chips.

It is also understood that an optimum clad bonding wire capable of forming a neck having a sufficient a low-boiling element. When the clad bonding wire in Sample 1 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire of high-purity Au.

The samples were subjected to n cycles of pull test (n=40. The results of the pull test are tabulated in Table 8.

TABLE 8

| Samples No. | Material of cladding (D₁) | Material of core wire (D₂) | $D_2/D_1$ (%) | Pull strength (g) | Number of mode C breakages (n = 40) | Cracking of chip | Class |
|---|---|---|---|---|---|---|---|
| 1 | Ag | Au | 14.0 | 13.5 | 5 | Not occurred | X |
| 2 | " | " | 15.0 | 13.5 | 23 | " | |
| 3 | " | " | 30.0 | 13.4 | 36 | " | ◎ |
| 4 | " | " | 55.0 | 13.0 | 32 | " | |
| 5 | " | " | 56.0 | 13.0 | 31 | Occurred | X |
| 6 | " | " | 79.0 | 12.6 | 31 | " | X |
| 7 | " | " | 80.0 | 12.5 | 33 | Not occurred | |
| 8 | " | " | 90.0 | 12.3 | 37 | " | ◎ |
| 9 | " | " | 99.0 | 12.0 | 29 | " | |
| 10 | " | " | 99.5 | 12.0 | 3 | " | X |
| 11 | Ag + Pd (10 at %) | " | 30.0 | 16.6 | 31 | " | |
| 12 | " | " | 85.0 | 13.4 | 35 | " | ◎ |
| 13 | Ag | Au + Pd (10 at %) | 30.0 | 13.7 | 32 | " | |
| 14 | " | Au + P (500 at ppm) | 30.0 | 13.4 | 37 | " | ◎ |
| 15 | | Au (99.99%) | | 12.0 | 2 | | |

It is obvious from Table 8 that the numbers of mode C breakages in the clad bonding wires of the present invention are far greater than the number of mode C breakages in the comparative example, which proves that the necks of the clad bonding wires of the present invention are stronger than other portion of the corresponding clad bonding wires. Furthermore, the clad bonding wires of the present invention meeting an inequality: $15\% \leq D_2/D_1 \leq 55\%$ or $80\% \leq D_2/D_1 \leq 995$ is capable of forming necks having a sufficient strength and balls having appropriate hardness. It is understood from Table 8 that an optimum clad bonding wire can be formed by using a cladding 1 of a Ag alloy or a core wire 2 of a Au alloy or by using a material containing a low-boiling element.

EXAMPLE 9

Sample clad bonding wires of 30 μm in diameter were fabricated by cladding core wires 2 of high-purity Ag of a Ag alloy with claddings 1 of high-purity Pd or a Pd alloy to form clad wires, drawing the clad wires and annealing the same during drawing, and subjecting the drawn clad wires to a stress relieving process. The sample clad bonding wires differ from each other in the wire-to cladding diameter ratio $D_2/D_1$.

Samples 1 to 10 are clad bonding wires formed by cladding core wires 2 of high-purity Ag with claddings 1 of high-purity Pd, respectively; Samples 11 and 12 are clad bonding wires formed by cladding core wires 2 of high-purity Ag containing 5 at.% Au with claddings 1 of high-purity Pd containing 3 at.% Au, respectively Sample 14 is a clad bonding wire formed by cladding a core wire 2 of high-purity Ag or a Ag alloy with a cladding 1 of high-purity Pd or a Pd alloy, in which both the cladding 1 and the core wire 2 or either the cladding 1 or the core wire 2 contains a low-boiling element having a boiling point lower than the fusing point of the base material of the same; and Sample 15 is a conventional bonding wire for a semiconductor device as a comparative example.

In Example 9, the cladding 1 of Sample 14 is formed of high-purity Pd, and the core wire 2 of the same is formed of high-purity Ag containing 500 at ppm P, i.e., a low-boiling element. When the clad bonding wire in Sample 14 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire of high-purity Au (99.99%).

The samples were subjected to n cycles of pull test (n=40). The results of the pull test are tabulated in Table 9.

TABLE 9

| Samples No. | Material of cladding (D₁) | Material of core wire (D₂) | $D_2/D_1$ (%) | Pull strength (g) | Number of mode C breakages (n = 40) | Cracking of chip | Class |
|---|---|---|---|---|---|---|---|
| 1 | Pd | Ag | 14.0 | 18.9 | 6 | Not occurred | X |
| 2 | " | " | 15.0 | 18.9 | 24 | " | |
| 3 | " | " | 20.0 | 18.8 | 36 | " | ◎ |
| 4 | " | " | 25.0 | 18.7 | 33 | " | |
| 5 | " | " | 26.0 | 18.6 | 32 | Occurred | X |
| 6 | " | " | 89.0 | 14.6 | 31 | " | X |
| 7 | " | " | 90.0 | 14.5 | 30 | Not occurred | |
| 8 | " | " | 95.0 | 14.0 | 37 | " | ◎ |
| 9 | " | " | 99.0 | 13.6 | 26 | " | |
| 10 | " | " | 99.5 | 13.6 | 5 | " | X |
| 11 | Pd + Au (3 at %) | " | 20.0 | 20.9 | 32 | " | |
| 12 | " | " | 90.0 | 15.0 | 37 | " | ◎ |
| 13 | Pd | Ag + Au (5 at %) | 20.0 | 19.1 | 33 | " | |
| 14 | " | Ag + P (500 at ppm) | 20.0 | 18.8 | 38 | " | ◎ |
| 15 | | Au (99.99%) | | 12.0 | 2 | " | |

It is obvious from Table 9 that the number of mode C breakages in the clad bonding wires of the present invention are far greater than the number of mode C breakages in the comparative example, which proves that the necks of the clad bonding wires of the present invention are stronger than that of other portion of the corresponding clad bonding wires, and that the clad bonding wires meeting an inequality: $15\% \leq D_2/D_1 \leq 25\%$ or $905 \leq D_2/D_1 \leq 99\%$ are capable of forming necks having a sufficient strength and balls The samples were subjected to n cycles of pull test (n=40). The results of the pull test are tabulated in Table 10.

TABLE 10

| Samples No. | Material of cladding ($D_1$) | Material of core wire ($D_2$) | $D_2/D_1$ (%) | Pull strength (g) | Number of mode C breakages (n = 40) | Cracking of chip | Class |
|---|---|---|---|---|---|---|---|
| 1 | Ag | Pd | 14.0 | 13.6 | 5 | Not occurred | X |
| 2 | " | " | 15.0 | 13.6 | 22 | " | |
| 3 | " | " | 35.0 | 14.2 | 29 | " | |
| 4 | " | " | 45.0 | 14.6 | 35 | " | ⊙ |
| 5 | " | " | 46.0 | 14.7 | 32 | Occurred | X |
| 6 | " | " | 95.0 | 18.5 | 31 | " | X |
| 7 | " | " | 96.0 | 18.6 | 33 | Not occurred | |
| 8 | " | " | 97.0 | 18.7 | 38 | " | ⊙ |
| 9 | " | " | 99.0 | 18.9 | 28 | " | |
| 10 | " | " | 99.5 | 18.9 | 4 | " | X |
| 11 | Ag + Au (5 at %) | " | 30.0 | 20.4 | 36 | " | ⊙ |
| 12 | " | " | 97.0 | 19.1 | 32 | " | |
| 13 | Ag | Pd + Au (3 at %) | 30.0 | 14.2 | 29 | " | |
| 14 | " | Pd + P (500 at ppm) | 30.0 | 14.0 | 37 | " | ⊙ |
| 15 | | Au (99.99%) | | 12.0 | 2 | " | | having appropriate hardness. Furthermore, it is understood an optimum clad bonding wire can be formed by using a cladding 1 of a Pd alloy or a core wire 2 of a Ag alloy or by using a material containing a low-boiling element.

EXAMPLE 10

Sample clad bonding wires of 30 μm in diameter were fabricated by cladding core wires 2 of high-purity Pd or a Pd alloy with claddings 1 of high-purity Ag or a Ag alloy to form clad wires, drawing the clad wires and annealing the same during drawing, and subjecting the drawn clad wire to a stress relieving process. The sample clad bonding wires differ from each other in the wire-to-cladding diameter ratio $D_2/D_1$.

Samples 1 to 10 are clad bonding wires formed by cladding core wires of high-purity Pd with claddings 1 of high-purity Ag, respectively; Samples 11 and 12 are clad bonding wires formed by cladding core wires 2 of high-purity Pd with claddings 1 of high-purity Ag containing 5 at.% Au, respectively; Sample 13 is a clad bonding wire formed by cladding a core wire of high-purity Pd containing 3 at.% Au with a cladding 1 of high-purity Ag; Sample 14 is a clad bonding wire formed by cladding a core wire of high-purity Pd or a Pd alloy with a cladding 1 of high-purity Ag or a Ag alloy, in which both the cladding 1 and the core wire 2 or either the cladding 1 or the core wire 2 contains a low-boiling element having a boiling point lower than the fusing point of the base material forming the same; and Sample 15 is a conventional bonding wire for a semiconductor device as a comparative example.

In Example 10, the cladding 1 of Sample 14 is formed of high-purity Ag, and the core wire 2 of the same is formed of high-purity Pd containing 500 at ppm P, i.e., a low-boiling element. When the clad bonding wire in Sample 14 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire formed of high-purity Au (99.99%).

It is obvious from Table 10 that the numbers of mode C breakages in Samples 1 to 15, i.e., the clad bonding wires of the present invention ion, are greater than the number of mode C breakages in Sample 15, i.e., a comparative example of the conventional bonding wire, which proves that the necks of the clad bonding wires of the present invention are stronger than other portions of the corresponding clad bonding wires. Furthermore, the clad bonding wires of the present invention meeting an inequality: $15\% \leq D_2/D_1 \leq 45\%$ or $96\% \leq D_2/D_1 \leq 99\%$ form necks having a sufficient strength and balls having appropriate hardness. It is understood from Table 10 that an optimum clad bonding wire can be formed by using a cladding 1 of a Ag alloy or a core wire 2 of a PD alloy or by using a material containing a low-boiling element.

EXAMPLE 11

Sample clad bonding wires of 30 μm in diameter were fabricated by cladding core wires 2 of high-purity Ag or a Ag alloy with claddings 1 of high-purity Pt or a Pt alloy to form clad wires, drawing the clad wires and annealing the same during drawing, and subjecting the drawn clad wires to a stress relieving process. The sample clad wires differ from each other in the wire-to-cladding diameter ratio $D_2/D_1$.

Samples 1 to 10 are clad bonding wires formed by cladding core sires 2 of high-purity Ag with claddings 1 of high-purity Pt, respectively; Samples 11 and 12 are clad bonding wires formed by cladding core wires 2 of high-purity Ag with claddings 1 of high-purity Pt containing 2 at.% Au, respectively; Sample 13 is a clad bonding wire formed by cladding a core wire 2 of high-purity Ag containing 5 at.% Au with a cladding 1 of high-purity Pt; Sample 14 is a clad bonding wire formed by cladding a core wire 2 of high-purity Ag or a Ag alloy with a cladding 1 of high-purity Pt or a Pt alloy, in which both the cladding 1 and the core wire 2 or either the cladding 1 or the core wire 2 contains a low-boiling element having a boiling point lower than the fusing point of the base material; and Sample 15 is a conventional bonding wire for a semiconductor device as a comparative example.

In Example 11, the cladding 1 of Sample 14 is formed of high-purity Pt, and the core wire is formed of high-purity Ag containing 500 at ppm P, i.e., a low-boiling element. When the clad bonding wire in Example 14 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire of high-purity At (99.99%).

The samples were subjected to n cycles of pull test (n=40). The results of the pull test are tabulated in Table 11 bonding wires, differ from each other in the wire-to-cladding diameter ratio $D_2/D_1$.

Samples 1 to 10 are clad bonding wires formed by cladding core wires of high-purity Pt with claddings 1 of high-purity Ag, respectively;

Samples 11 and 12 are clad bonding wires formed by cladding core wires 2 of high-purity Pt with claddings of high-purity Ag containing 5 at.% Au, respectively;

Sample 13 is a clad bonding wire formed by cladding a core wire 2 of high-purity Pt containing 2 At.% Au;

Sample 14 is a clad bonding wire formed by cladding a

TABLE 11

| Samples No. | Material of cladding ($D_1$) | Material of core wire ($D_2$) | $D_2/D_1$ (%) | Pull strength (g) | Number of mode C breakages (n = 40) | Cracking of chip | Class |
|---|---|---|---|---|---|---|---|
| 1 | Pt | Ag | 14.0 | 14.0 | 4 | Not occurred | X |
| 2 | " | " | 15.0 | 14.0 | 22 | " | |
| 3 | " | " | 20.0 | 14.0 | 35 | " | ◎ |
| 4 | " | " | 25.0 | 14.0 | 32 | " | |
| 5 | " | " | 26.0 | 14.0 | 33 | Occurred | X |
| 6 | " | " | 94.0 | 13.6 | 33 | " | X |
| 7 | " | " | 95.0 | 13.5 | 31 | Not occurred | |
| 8 | " | " | 97.0 | 13.5 | 32 | " | |
| 9 | " | " | 99.0 | 13.5 | 28 | " | |
| 10 | " | " | 99.5 | 13.5 | 5 | " | X |
| 11 | Pt + Au (2 at %) | " | 20.0 | 20.2 | 36 | " | ◎ |
| 12 | " | " | 97.0 | 13.9 | 33 | " | |
| 13 | Pt | Ag + Au (5 at %) | 20.0 | 13.3 | 36 | " | ◎ |
| 14 | " | Ag + P (500 at ppm) | 20.0 | 13.0 | 37 | " | ◎ |
| 15 | | Au (99.99%) | | 12.0 | 2 | " | |

It is obvious from Table 11 that the numbers of mode C breakages in the clad bonding wires of the present invention are greater than the number of mode C breakages in Sample 15, i.e., a comparative example of the conventional boding wire, which proves that the necks of the clad bonding wires of the present invention are stronger than other portion of the corresponding clad bonding wires. Furthermore, the clad bonding wires of the present invention meeting an inequality: $15\% \leq D_2/D_1 \leq 25\%$ or $95\% \leq D_2/D_1 \leq 99\%$ form necks having sufficient strength and balls having appropriate hardness. It is understood from Table 11 that an optimum clad bonding wire can be formed by using a cladding 1 of a Pt alloy or a core wire 2 of a Ag alloy or by using a material containing a low-boiling element.

EXAMPLE 12

Sample clad bonding wires of 30 μm in diameter were fabricated by cladding core wires of high-purity Pt or a Pt alloy with claddings 1 of high-purity Ag or Ag alloy to form clad wires, drawing the clad wires and annealing the same during drawing, and subjecting the drawn clad wires to a stress relieving process. The sample clad core 2 of high-purity Pt or a Pt alloy with a cladding 1 of high-purity Ag or a Ag alloy, in which both the cladding 1 and the core wire 2 or either the cladding 1 or the core wire 2 contains a low-boiling element having a boiling point lower than the fusing point of the base material; and Sample 15 is a conventional bonding wire for a semiconductor device as a comparative example.

In Example 12, the cladding 1 of Sample 14 is formed of high-purity Ag, and the core wire 2 of the same is formed of high-purity Pt containing 500 at ppm P, i.e., a low-boiling element. When the clad bonding wire in Sample 14 is heated to form a ball, the low-boiling element evaporates in the ball to prevent the characteristic gas absorption of the metal forming the ball, so that a satisfactory ball can be formed. The evaporating effort of the low-boiling element contained in the neck induces stress in the neck to enhance the breaking strength of the neck beyond that of other portion of the clad bonding wire.

Sample 15 is a Au bonding wire of high-purity Au (99.99%).

The samples were subjected to n cycles of pull test (n=40). The results of the pull test are tabulated in Table 12.

TABLE 12

| Samples No. | Material of cladding ($D_1$) | Material of core wire ($D_2$) | $D_2/D_1$ (%) | Pull strength (g) | Number of mode C breakages (n = 40) | Cracking of chip | Class |
|---|---|---|---|---|---|---|---|
| 1 | Ag | Pt | 14.0 | 13.5 | 5 | Not occurred | X |
| 2 | " | " | 15.0 | 13.5 | 21 | " | |
| 3 | " | " | 20.0 | 13.5 | 35 | " | ◎ |
| 4 | " | " | 30.0 | 13.5 | 33 | " | |
| 5 | " | " | 31.0 | 13.5 | 28 | Occurred | X |
| 6 | " | " | 95.0 | 14.0 | 30 | " | X |
| 7 | " | " | 96.0 | 14.0 | 33 | Not occurred | |
| 8 | " | " | 97.0 | 14.0 | 32 | " | |
| 9 | " | " | 99.0 | 14.0 | 27 | " | |
| 10 | " | " | 99.5 | 14.0 | 7 | " | X |

TABLE 12-continued

| Samples No. | Material of cladding (D₁) | Material of core wire (D₂) | D₂/D₁ (%) | Pull strength (g) | Number of mode C breakages (n = 40) | Cracking of chip | Class |
|---|---|---|---|---|---|---|---|
| 11 | Ag + Au (5 at %) | " | 20.0 | 20.2 | 36 | " | ◉ |
| 12 | " | " | 97.0 | 14.4 | 32 | " |  |
| 13 | Ag | Pt + Au (2 at %) | 20.0 | 14.3 | 35 | " | ◉ |
| 14 | " | Pt + P (500 at ppm) | 20.0 | 14.0 | 37 | " | ◉ |
| 15 |  | Au (99.99%) |  | 12.0 | 2 | " |  |

It is obvious from Table 12 that the numbers of mode C breakages in Samples 1 to 14 are far greater than the number of mode C breakages in Sample 15, i.e., a comparative example of the conventional bonding wire, which proves that the necks of the clad bonding wires of the present invention are stronger than other portions of the corresponding clad bonding wires. Furthermore, the clad bonding wires of the present invention meeting an inequality: $15\% \leq D_2/D_1 \leq 30\%$ or $96\% \leq D_2/D_1 \leq 995$ form necks having a sufficient strength and balls having appropriate hardness. It is understood from Table 12 that an optimum clad bonding wire can be formed by using a cladding 1 of a Ag alloy or a core wire 2 of a Pt alloy or by using a material containing a low-boiling element.

What is claimed is:

1. A clad bonding wire for a semiconductor device comprising:

a cladding formed of high-purity Au having a purity of at least 99.99% or a Au alloy of high purity Au; and a core wire cladded with said cladding and formed of high-purity Pd having a purity of at least 99.9% or a Pd alloy of high purity Pd.

2. A clad bonding wire according to claim 1, wherein said Pd alloy includes:

high purity Pd having a purity of at least 99.9%; and at least one material selected from the group consisting of Pt, Ag, In, Mg, Mo, Y, Ge, La and a low-boiling element having a boiling point lower than the fusing point of the base material.

3. A clad bonding wire according to claim 1, wherein said Au alloy includes:

high purity Au having a purity of at least 99.99%; and at least one material selected from the group consisting of Pt, Ag, Cu, In, Ge, Mo, Y, Zr, Be, Ca, La, Mg and a low-boiling element having a boiling point lower than the fusing point of the base material.

4. A clad bonding wire according to claim 1, wherein said core wire has a diameter D2, and said clad bonding wire has a diameter D1, said clad bonding wire further comprising a wire-to-cladding diameter ratio D2/D1, wherein $0.15 \leq D2/D1 \leq 0.75$.

5. A clad bonding wire according to claim 1, wherein said core wire has a diameter D2 and said clad bonding wire has a diameter D1, said clad bonding wire further comprising a wire-to-cladding diameter ratio D2/D1, wherein $0.95 \leq D2/D1 \leq 0.99$.

6. A clad bonding wire according to claim 1, wherein said core wire has a diameter D2 and said clad bonding wire has a diameter D1, said clad bonding wire further comprising a wire-to-cladding diameter ratio D2/D1, wherein $0.98 \leq D2/D1 \leq 0.99$.

7. A clad bonding wire for a semiconductor device comprising:

a cladding formed of high-purity Au having a purity of at least 99.99% or a Au alloy of high purity Au; and a core wire cladded with said cladding and formed of high-purity Pt having a purity of at least 99.95% or a Pt alloy of high purity Pt.

8. A clad bonding wire according to claim 7, wherein said Au alloy includes:

high purity Au having a purity of at least 99.99%; and at least one material selected from the group consisting of Pd, Ag, Cu, In, Ge, Mo, Y, Zr, Be, Ca, La, Mg and a low-boiling element having a boiling point lower than the fusing point of the base material.

9. A clad bonding wire according to claim 7, wherein said Pt alloy includes:

high purity Pt having a purity of at least 99.95%; and at least one material selected from the group consisting of Ag, pd, Be, Cu, Mo, Ca, In and a low-boiling element having a boiling point lower than the fusing point of the base material.

10. A clad bonding wire according to claim 7, wherein said core wire has a diameter D2 and said clad bonding wire has a diameter D1, said clad bonding wire further comprising a wire-to-cladding diameter ratio D2/D1, wherein $0.15 \leq D2/D1 \leq 0.40$.

* * * * *

UNITED STATES PATENT AND TRADEMARK OFFICE
CERTIFICATE OF CORRECTION

PATENT NO. : 5,364,706
DATED : November 15, 1994
INVENTOR(S) : Katsuyuki TOYOFUKU et al.

It is certified that error appears in the above-indentified patent and that said Letters Patent is hereby corrected as shown below:

At the cover sheet, section [57], line 9 of the abstract, change "99" to ---99%---.

At column 22, line 19 (claim 6, line 1) of the printed patent change "1" to ---7---.

At column 22, line 44 (claim 9, line 4), change "pd" to ---Pd---.

At column 1, line 34, change "by by" to ---by---.

At column 2, line 40, delete ", in the case of Pd core,".

At column 2, line 42, insert ---(in case of Pd core), Pd in 20 at.% or less (in case of Pt core)--- after "less,".

At column 2, line 52, change "alloy." to ---alloy---.

At column 4, line 40, change "at ppm" to ---at.ppm---.

At column 4, line 46, change "Low-boiling" to ---low-boiling---.

At column 5, line 55, change "at ppm" to ---at.ppm---.

At column 7, line 24, change "at ppm" to ---at.ppm---.

At column 7, line 63, change "wires," to ---wires.---.

At column 8, line 36, change "Pd" to ---Pd;---.

At column 8, line 61, change "tile" to ---the---.

UNITED STATES PATENT AND TRADEMARK OFFICE
CERTIFICATE OF CORRECTION

PATENT NO. : 5,364,706
DATED : November 15, 1994
INVENTOR(S) : Katsuyuki TOYOFUKU et al.

It is certified that error appears in the above-indentified patent and that said Letters Patent is hereby corrected as shown below:

At column 8, line 66, change "at ppm" to ---at.ppm---.

At column 10, line 40, change "at ppm" to ---at.ppm---.

At column 11, line 17, change "$D_2D_1$" to ---$D_2/D_1$---.

At column 13, line 1, change "10 to 10" to ---1 to 10---.

At column 14, line 24, change "2wire" to ---wire---.

At column 14, line 67, change "(n=40" to ---(n=40)---.

At column 15, line 27, change "995" to ---99%---.

At column 17, line 2, change "905" to ---90%---.

At column 18, line 39, change "EXAMPLE11" to ---EXAMPLE 11---.

At column 21, line 20, change "995" to ---99%---.

Signed and Sealed this

Twenty-first Day of January, 1997

Attest:

BRUCE LEHMAN

*Attesting Officer*　　*Commissioner of Patents and Trademarks*